United States Patent [19]

Deane

[11] Patent Number: 4,883,976

[45] Date of Patent: Nov. 28, 1989

[54] LOW POWER DUAL-MODE CMOS BIAS VOLTAGE GENERATOR

[75] Inventor: Peter Deane, Sunnyvale, Calif.

[73] Assignee: Xicor, Inc., Milpitas, Calif.

[21] Appl. No.: 127,934

[22] Filed: Dec. 2, 1987

[51] Int. Cl.$^4$ .................... H03K 3/01; H03K 19/003; H03K 19/096

[52] U.S. Cl. ................................ 307/291.2; 307/443; 307/452; 307/296.5

[58] Field of Search .......... 307/443, 452, 296.2–296.5, 307/448

[56] References Cited

U.S. PATENT DOCUMENTS

4,585,954  4/1986  Hashimoto et al. ............. 307/296.2
4,695,746  9/1987  Tobita .............................. 307/296.2

Primary Examiner—John S. Heyman
Assistant Examiner—Margaret Rose Wanbach
Attorney, Agent, or Firm—Fitch, Even, Tabin & Flannery

[57] ABSTRACT

A substrate voltage bias generator is disclosed including a charge pump whose output is clamped during charge pump capacitor charging cycles to zero volts thereby eliminating a voltage drop associated with prior art clamping diodes. The charge pump further includes a stand-by and booted mode, the stand-by mode providing a first level of output current at a specified generated substrate bias voltage and in the booted mode generating increased output current and voltage. The increased voltage is generated across the charge pump capacitor by a second capacitor that is only operative in the booted mode and whose charge is shared with the charge pump capacitor thereby developing a higher voltage across the charge pump capacitor. The output voltage generated by the substrate bias generator is detected and if it is too low a voltage, the booted mode is turned off. An external signal determines whether the stand-by mode or booted mode are selected.

8 Claims, 5 Drawing Sheets

LOW POWER DUAL-MODE CMOS BIAS VOLTAGE GENERATOR

FIELD OF THE INVENTION

This invention relates to the field of integrated circuit bias voltage generators and more specifically to bias voltage generators adapted for use with electrically erasable read-only memories (EEPROMS).

BACKGROUND OF THE INVENTION

Today's integrated circuit industry has produced a class of devices which operate from a relatively low voltage power source with relatively low power consumption. Most known integrated circuit families require an approximately five volt power source to operate properly. Three volt devices are becoming increasingly popular. The reduction in power source voltage requirements eases the demands on the power source. In other words, devices which operate at three volts are more readily adapted for use with power sources such as batteries than devices which operate at five volts. For most battery technologies, batteries which produce three volts are smaller and simpler than batteries which produce higher voltages. Many three volt single cell batteries are currently available. Since one goal in the design of three volt circuits is to maximize their usefulness with power sources with limited capacity, it is highly desirable to minimize current consumption of each circuit. The integrated circuit designer is therefore faced with the conflicting tasks of reducing the operating voltage of a circuit while at the same time minimizing the current requirements of the circuit.

Many integrated technologies have been readily adapted for operation at three volts. For example, three volt microprocessors and certain types of memory devices are currently available. However, electrically erasable read only memory (EEPROM) devices which operate at three volts with minimal current consumption have heretofore been impossible to manufacture. EEPROM devices provide non-volatile memory storage which may be accessed and altered using electrical signals which are typically generated by a microprocessor. Since the data stored in EEPROM devices is retained even in the absence of power, they are highly desirable for use in battery powered applications. However, EEPROM devices employ voltages for programming and erasing memory cells which do not exist in other integrated circuit technologies. For example, in one EEPROM family, a programming voltage in the range of twenty-five volts is required to program a memory cell.

While the twenty-five volt high voltage signal may be generated by "on-chip" circuitry, it is more difficult to generate twenty-five volts from a three volt power source than it is to generate it from a five volt power source. In addition, EEPROM devices employ negative voltages during operation in certain modes. In "floating gate" EEPROM devices, a three layer polysilicon and oxide structure may be used for nonvolatile memory storage. The EEPROM comprises a plurality of cells which incorporate this three layer polysilicon memory structure. One of the polysilicon layers is electrically insulated from the others and it is referred to as a "floating gate." The floating gate cooperates with a programming electrode which either places charge on or removes charge from the floating gate. As charge is placed on and removed from the floating gate, the three layer polysilicon structure is switched between conductive and non-conductive states. Since the floating gate is electrically insulated, whatever charge is placed on the floating gate will remain there until altered by the programming electrode. This type of EEPROM memory structure is typically referred to as a "thick-oxide EEPROM." For a detailed description of the operation of this type EEPROM memory, refer to U.S. Pat. No. 4,274,012, invented by Simko and assigned to the assignee of the present invention. This patent and all other U.S. Pat. Nos. mentioned below are incorporated herein by reference.

Since a thick oxide EEPROM structure depends on capacitive effects between the programming electrode and the floating gate, relatively high voltages, typically in the range of twenty-five volts, are required to program the floating gate. A typical input structure for EEPROM devices include a lateral NPNP structure formed with the substrate which may latch-up due to voltage undershoot caused by ringing in the system. If such a latch-up should occur, the memory device would consume a large amount of current. Unwanted effects may be introduced across adjacent cells when high voltage is present on the programming electrode (word lines). A latch-up is also possible whenever the voltage applied to the cell exceeds the field threshold of the parasitic transistors of the device. The field threshold is the gate voltage at which a parasitic thick oxide MOSFET turns on such that adjacent cells are no longer isolated from one another and therefore cannot be programmed and erased independently of one another.

It is known that the field threshold of a parasitic field-effect transistor is directly related to the bias voltage applied to the substrate of the cell. Specifically, as an increasingly negative voltage is applied to the substrate, the field threshold of a parasitic field transistor also rises. Specifically, in a typical thick-oxide EEPROM device, if zero volts are applied to the substrate, the parasitic field transistor will have a field threshold of approximately ten volts. Therefore, programming voltages in excess of ten volts may induce latch-up or cause incorrect programming in the device when the substrate bias is maintained at zero volts. If the substrate bias is maintained at −1 volts, the field threshold rises to approximately seventeen volts. Since thick-oxide memory cells require approximately twenty-five volts for accurate programming, a substrate voltage of between −2 volts and −3 volts is required to prevent data corruption and permit fully independent non-volatile operation of adjacent cells.

Since typical logic families today may operate from either three volts or five volts, devices which may be operated at both voltages are especially desirable. This complicates the design of thick oxide EEPROM devices. The generation of a −3 volt substrate bias voltage is not a significant problem when the circuit is operated from a five volt power source. However, when the voltage of the power source is reduced to three volts, the generation of −3 volts is particularly difficult for all known negative voltage bias generator topologies. Furthermore, known negative voltage bias generator topologies, if optimized for operation at three volts, produce excessively negative voltages if the positive power source voltage is raised to a higher voltage, thus resulting in unwanted and unnecessary current consumption.

SUMMARY OF THE INVENTION

Briefly described, the present invention contemplates a substrate bias voltage generator which is readily adapted for use with devices which operate at voltages as low as three volts while also providing improved performance at higher voltages. The present bias voltage generator produces a bias voltage of approximately $-3$ volts whether operated from a three volt power source or a power source having a higher voltage. The present bias voltage generator operates in a plurality of modes and adaptively adjusts for changes in power source voltage changes and generator loading.

The present invention incorporates a novel charge pump means which provides an improvement over prior bias voltage generators by clamping the output side of a charge pump capacitor during charging cycles, thus eliminating a voltage drop associated with clamping diodes in prior circuits. In another aspect of the present invention, means are provided for switching the present invention between standby and booted modes. In the booted mode, booting means are activated to provide increased output voltage during the booted mode. The booted mode also switches the bias voltage generator to a high output current state which accommodates the high programming voltage of EEPROM cells. The booting means includes an auxiliary charge pump means for generating a charge pump output voltage at least as large in magnitude as the positive power supply input voltage. In the standby mode, the booting means is disabled by booted mode logic means. The booted mode logic means includes means for detecting the voltage at the output of the bias voltage generator and disabling the bias voltage generator whenever its voltage at its output is within acceptable limits. In yet another aspect of the present invention, means are provided for selecting one of a plurality of clock signals for clocking the present bias voltage generator. The plurality of clock signals are disposed with a variety of frequencies and are selected based on a desired output current for the bias voltage generator.

Accordingly, it is an object of the present invention to provide an integrated circuit bias voltage generator which is operable from a relatively low voltage and which is capable of producing negative voltages having a magnitude equal to or greater than the positive power source voltage.

It is another object of the present invention to provide a bias voltage generator which adaptively switches between a plurality of modes wherein each respective mode is optimized for particular output voltage levels, current levels and energy consumption.

It is still another object of the present invention to minimize current consumption in an integrated circuit bias voltage generator.

It is yet another object of the present invention to provide an integrated circuit bias voltage generator which includes a means for sensing the voltage of a load and for disabling the bias voltage generator when the sensed voltage is within acceptable limits.

BRIEF DESCRIPTION OF THE DRAWING

These and other objects will be appreciated through the specification below and the accompanying drawings in which.

DETAILED DESCRIPTION OF THE INVENTION

Thick-oxide EEPROM cells require a negative substrate voltage during various operating modes. In prior circuits, designed for operation from a five volt power source, the negative substrate voltage is typically generated by the circuit shown in FIG. 1. This circuit 100 is adapted to receive a clock signal at terminal 102. The clock signal coupled to terminal 102 may have a range of frequencies and vary in amplitude between zero volts and five volts (or the voltage of the positive power source). The clock signal is coupled to an inverter structure 104 through capacitor 106 which is disposed between terminal 102 and node "Y" of inverter 104. The inverter structure 104 includes n-channel device 108 and n-channel device 110. N-channel device 108 is disposed with its drain coupled to terminal $V_{SS}$ which is typically maintained at approximately zero volts. The gate and source of n-channel device 108 is disposed with its gate and source coupled to node "Y" of inverter 104. N-channel device 110 is disposed with its source coupled to node "Y" of inverter 104 and its gate and drain coupled to output terminal 112.

Figure 1:
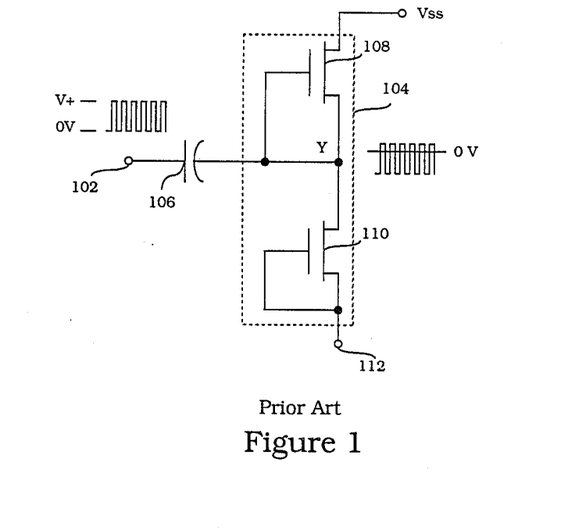
FIG. 1 is a schematic diagram of a prior art bias voltage generator.

In operation, the clock signal at terminal 102 alternates between zero volts and five volts. This signal is AC coupled to node "Y" by capacitor 106. As the voltage at node "Y" swings positive, n-channel device 108 is forced into conduction, thus clamping the positive voltage swing at node "Y" to approximately $+1$ volts. Therefore, the voltage at node "Y" alternates between $+1$ volt and $-4$ volts. This in turn drives output terminal 112 to a voltage of approximately $-3$ volts during negative voltage swings. Since transistor 110 functions as a diode, a load which is coupled to output terminal 112 will be driven to approximately $-3$ volts with an input signal which alternates between zero volts and five volts.

There are several disadvantages with the above technique. In thick-oxide EEPROM cells, it is necessary to maintain the substrate at approximately $-3$ volts to provide adequate field thresholds and so that cell operating voltages can be predicted with accuracy. If the above circuit is operated from a five volt power source, it provides the required $-3$ volt voltage. The maximum output (most negative output) which can be produced by the circuit above is the voltage of the power source minus the ($V_t$) voltage drops of transistors 108 and 110. A $V_t$ voltage drop is the threshold voltage of a transistor operating in the active region. Under normal conditions, the $V_t$ voltage drop of these transistors may be as high as one volt. Therefore, if the circuit 100 is driven by a zero to five volt input signal, the most negative voltage which can be produced is $-3$ volts. If the input signal is reduced to 0–3 volts, the most negative voltage which can be produced is $-1$ volt which is not sufficient for use with thick-oxide EEPROM devices.

Another problem with the circuit 100 is that it is not regulated. It produces the same output current regardless of load conditions. This is not a problem when the circuit is operated at a relatively high voltage. However, in three volt designs, the power constraints are more critical and the circuit 100 wastes power during periods of low memory activity. Furthermore, the most negative voltage which can be produced by the circuit 100 is directly related to the positive power source voltage and therefore is not readily adapted for use in multi-voltage designs.

Figure 2:
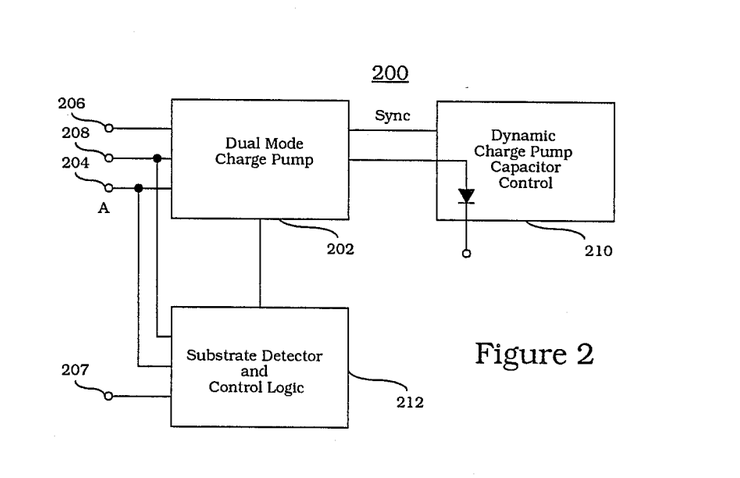
FIG. 2 is a block diagram of the dual-mode bias voltage generator of the present invention.

The present invention provides an improvement over the circuit 100 with the novel charge pump structure shown in block diagram form in FIG. 2. The structure 200 includes a dual mode charge pump 202 which may be operated in standby and "booted modes." The booted mode is selected whenever high output voltage and current is required. The booted mode is controlled by a booted mode enable signal "A" which is coupled to terminal 204. The booted mode enable signal "A" is typically generated by control circuitry (not shown) which sequences the EEPROM device through its various operating modes. The enable signal "A" would typically be activated whenever the EEPROM is in a high power programming mode.

The dual mode charge pump 202 is adapted to receive relatively fast and slow clock signals at terminals 206 and 208, respectively. When the dual mode charge pump is operating in the standby mode, the slow oscillator signal is coupled to the charge pump circuitry. When the dual mode charge pump is operating in the booted mode, the fast oscillator is coupled to the charge pump circuitry under the control of the substrate detector and control logic section 212.

The dual mode charge pump includes two charge pump sections. In the standby mode, one of the charge pump sections (the booted mode charge pump) is disabled, thus conserving power. In the booted mode, the booted mode charge pump is activated to provide additional output voltage and current. The structure 200 further includes a dynamic charge pump capacitor control circuit 210 which eliminates a threshold voltage drop inherent in the circuit 100. In the preferred practice of the present invention, the dual mode charge pump is used to charge one or more charge pump capacitors to the voltage of the positive power source during charging cycles. During charging cycles, the dynamic charge pump capacitor control circuit 210 clamps the output terminal of the charge pump capacitor to zero volts while the other terminal of the charge pump capacitor is driven to a positive voltage which is approximately equal to the voltage of the positive power source. During pumping cycles, the dynamic capacitor control circuit 210 unclamps the output terminal of the charge pump capacitor while its most positive terminal is driven to zero volts, thus producing a negative voltage at the output terminal of the charge pump capacitor.

The structure 200 includes a substrate detector and control logic section 212 which monitors the substrate voltage level during memory operation. In the booted mode, the present bias voltage generator is capable of producing more current and voltage than is required to maintain the substrate voltage within desired limits. The substrate detector and control logic section 212 monitors the substrate voltage level and it disables the dual-mode charge pump 202 whenever sufficient bias voltage is present on the substrate. The substrate detector and control logic section 212 therefore provide both a means of conserving power and a means of maintaining or regulating the substrate bias voltage within predefined limits. The voltage regulation aspect of the present invention is especially important in EEPROM applications where the substrate voltage is often used as a reference voltage in EEPROM cells. Therefore, predictable EEPROM operation demands that the substrate voltage be regulated over a relatively narrow range. The substrate detector and control logic section 212 also allows the structure 200 to be operated over a wide range of voltages because the booted mode charge-pump is activated only when it is necessary to maintain the substrate voltage within predefined limits and therefore the substrate bias voltage is independent of positive power source voltage.

Figure 3:
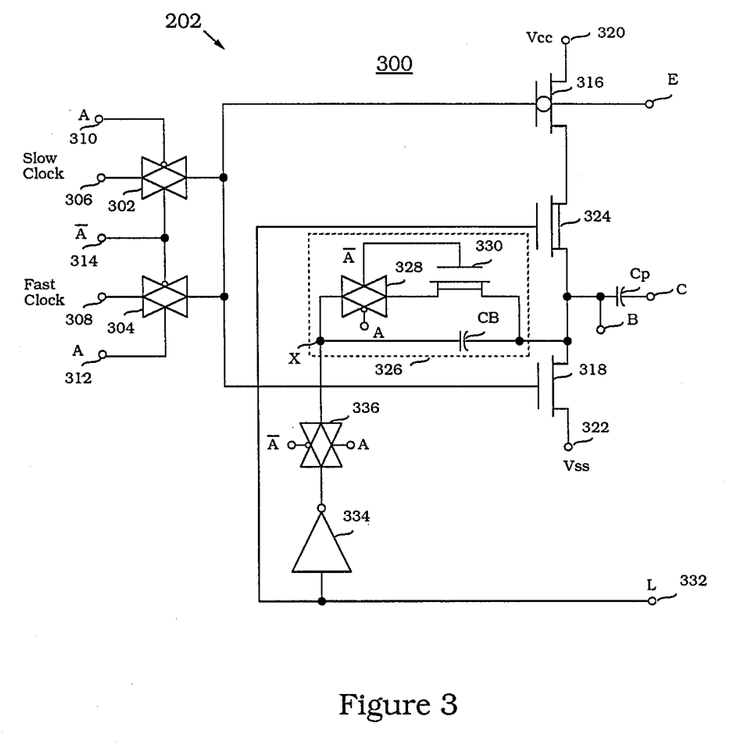
FIG. 3 is a schematic diagram of the dual mode charge pump of the present invention.

Referring now to FIG. 3, the circuit 300 shown schematically is a detailed implementation of the dual-mode charge pump 202. The clock inputs to the circuit 300 are controlled by transmission gates 302 and 304. Specifically, the input terminal 306 of transmission gate 302 is coupled to a relatively slow clock signal. The input terminal 308 of transmission gate 304 is coupled to a relatively fast clock signal. The relatively fast and relatively slow clock signals may be any of a number of frequencies which may be selected based on a desired output current during various modes of operation. These clock signals would typically vary in magnitude between zero volts and the voltage of the positive power source. These signals may be generated by a number of well known circuits and would typically be derived from the EEPROM control circuitry (not shown).

The transmission gates 302 and 304 are used to select either the relatively fast or relatively slow clock signals based on the booted mode enable signal "A" which is coupled to terminals 310 and 312 and signal "Ā" which is coupled to terminal 314. Terminal 310 is coupled to the inverting control input of transmission gate 302. Terminal 312 is coupled to the non-inverting control input of transmission gate 304. Terminal 314 is coupled of the non-inverting and inverting control inputs of transmission gates 302 and 304, respectively.

The outputs of transmission gates 302 and 304 are coupled in common and this common connection is further coupled to the gate terminals of a p-channel transistor 316 and an n-channel transistor 318. The source of transistor 316 is coupled to the positive power supply $V_{CC}$ terminal 320. The drain of transistor 318 is coupled to the ground $V_{SS}$ terminal 322. A depletion pass transistor 324 is disposed between transistors 316 and 318 wherein the drain of transistor 316 is coupled to the source of transistor 324 and the drain of transistor 324 is coupled to the source of transistor 318. The common connection of the drain of transistor 324 and the source of transistor 318 is further coupled to a charge-pump capacitor Cp wherein this junction is referred to as node "B" or the charge pump side of the charge pump capacitor Cp. The gate of transistor 324 is controlled by control signal "L" which is generated by the circuit of FIG. 5.

The circuit 300 further includes the booted-mode charge pump 326 formed by capacitor CB, transmission gate 328 and depletion pass transistor 330. The source of transistor 330 and one terminal of capacitor CB are coupled in common. This common connection is further coupled to node "B." The gate of transistor 330 and the inverting control input of transmission gate 328 are coupled to the inverted boot mode enable signal "A." The inverting input of transmission gate 328 is coupled to the boot mode enable signal "A." One transmission path input of transmission gate 328 is coupled to the drain of transistor 330. The other transmission path input of transmission gate 328 is coupled to capacitor CB. The common junction of the input of transmission gate 328 and capacitor CB is coupled to terminal 332 (control signal "L") through inverter 334 and transmission gate 36. The conductivity of transmission gate 336 is controlled by the boot mode enable signal "A" and signal "A." When the boot mode enable signal "A" is low (the standby mode), the transmission gate 336 is in a non-conductive state and the control signal "L" is isolated from capacitor CB and transmission gate 328. Further, when the boot mode enable signal "A" is low, transmission gate 328 is conductive, thereby clamping the voltage across capacitor CB at zero volts. Therefore, in the standby mode, the boot mode charge pump 326 is completely disabled and no energy is consumed in the boot mode capacitor in the standby mode. When the booted mode enable signal "A" is high, transistor 330 is non-conductive, thus isolating transmission gate 328 from voltage present on charge-pump capacitor CB and preventing biasing or break-down of transmission gate 328.

In the standby mode, the circuit 300 operates in a manner similar to conventional charge pumps. When the booted mode enable signal "A" is low, the relatively slow oscillator signal is coupled to transistors 316 and 318 through transmission gate 302. As the clock signal swings between the positive input voltage and zero volts, transistors 316 and 318 are alternately switched "ON" and "OFF," thereby switching one side of capacitor Cp between approximately zero volts and the positive power source voltage. In the standby mode, the control signal "L" is held high and transistor 324 has no effect on the operation of the charge pump. As will be discussed in more detail below, the output side of the charge-pump capacitor Cp is clamped to zero volts during the charge pump charging cycles. During charge pump output cycles, the most positive side of the capacitor is switched to zero volts and the output side of the charge pump capacitor is forced to some negative voltage. The most negative voltage which can be generated is directly affected by the clamping voltage on the output side of the charge pump capacitor during charge pump charging cycles.

The output side of capacitor Cp, node "C," is controlled by the dynamic charge-pump capacitor control circuit 210. In all bias voltage generators, a diode is placed at the output of the device to prevent leakage during charge pump charging cycles. In prior bias voltage generators this diode is also used to clamp the positive voltage swing at the output side of the charge pump capacitor, thus allowing the clamping voltage to rise to approximately one volt (the threshold voltage of the diode). The present invention eliminates the threshold voltage drop of this diode by clamping node "C" of the charge pump capacitor Cp to zero volts during charging cycles, thereby eliminating the diode voltage offset inherent in previous designs.

Figure 4:
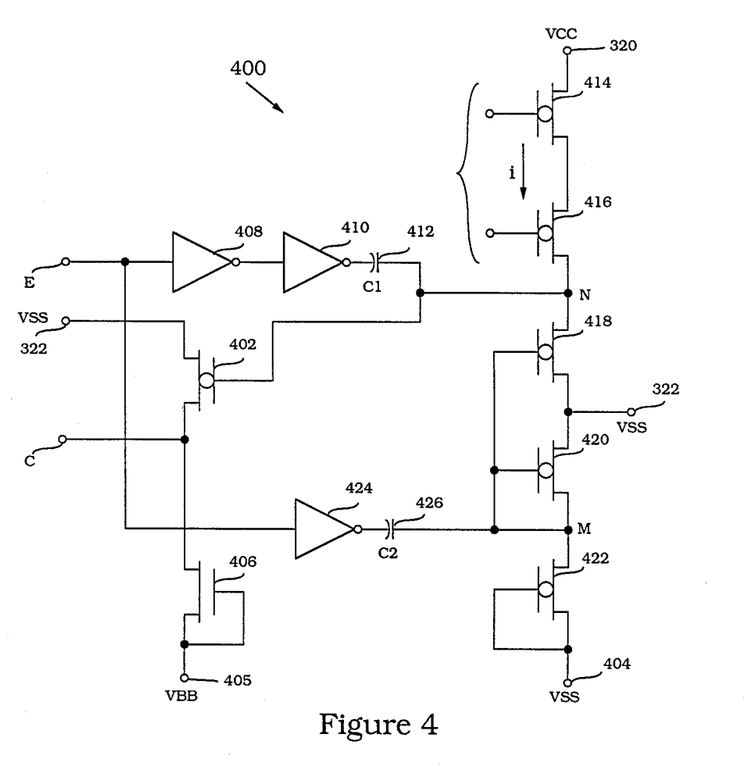
FIG. 4 is a schematic diagram of the control logic section of the present invention.

Referring now to FIG. 4, the circuit 400 shown schematically is the detailed implementation of the dynamic charge-pump capacitor control circuit 210. The circuit 400 includes a p-channel transistor 402 which is disposed with its drain coupled to $V_{SS}$ (ground) terminal 322 and its source coupled to node "C." A transistor 406 is disposed in a diode configuration between node "C" and the bias voltage generator output terminal $V_{BB}$. Clamping transistor 402 is used to clamp node "C" to $V_{SS}$ during charge pump charging cycles. It should be noted that the circuit 400 is active in both standby and booted modes.

The gate of transistor 402 is coupled to node "N" which is switched by a network which is responsive to the currently selected clock signal. In the preferred practice of the present invention, it is desirable to switch clamping transistor 402 rapidly and to drive it hard during charging cycles to facilitate rapid charging of the charge pump capacitor Cp. The currently selected clock signal is coupled to the circuit 400 at node "E." Inverters 408 and 410, which are series coupled between node "E" and capacitor 412, buffer the clock signal. Capacitor 412 is disposed in series between the output of inverter 410 and node "N." A plurality of p-channel devices 414–420 are disposed in series between $V_{CC}$ and $V_{SS}$ to precisely control the switching of node "N" and the gate of transistor 402. Specifically, transistors 414 and 416 are disposed with their respective drain and source terminals, coupled together. The source of transistor 414 is coupled to $V_{CC}$ terminal 320. The gates of transistors 414 and 416 are coupled to voltage references generated by a p-channel current mirror circuit (not shown). The drain of transistor 416 is coupled to node "N."

Transistors 414 and 416 comprise a current source which delivers a fixed amount of current to node "N." Transistors 418 and 420 are disposed in series between node "N" and node "M." Specifically, transistor 418 is disposed with its source coupled to node "N." The drain of transistor 418 is coupled to the source of transistor 420 and this common connection is further coupled to $V_{SS}$ terminal 322. The source of transistor 420 and the respective gate terminals of transistors 418 and 420 are each coupled to node "M." An inverter 424 and a capacitor 426 are disposed in series between node "E" and node "M" so that an inverted representation of the signal appearing at node "E" appears at node "M." A p-channel transistor 422 is disposed with its source coupled to node "M."

In operation, as the gate of transistor 318 is driven high by the presently selected clock signal, the voltage at node "E" is also driven high. As node "E" is driven high, the input to capacitor 412 is driven high while the input to capacitor 426 is driven low. As the input to capacitor 412 is driven high, node "N" is coupled upward, thus turning clamping transistor 402 "OFF," and unclamping node "C." Whenever transistor 402 is "OFF," node "C" is unclamped or "floating" and the negative coupling of the downward transition at node "B" is coupled to $V_{BB}$ through diode 406.

On downward clock transitions at the gate of transistor 318, node "B" is pulled high, the input to capacitor 412 is pulled low and the input to capacitor 426 is pulled high. As the input to capacitor 426 is driven low, node "M" is driven low and clamped to a minus threshold voltage by transistor 420. Since the gate of transistor 418 is also clamped to a minus threshold voltage by transistor 420, transistor 418 is fully conductive and node "N" is clamped at zero volts, thus turning transistor 402 "OFF" fully. As will be discussed further, driving transistor 402 with as much current as possible is also desirable for the booted mode described below.

As mentioned above, during clamping by clamping transistor 402, it is desirable to drive clamping transistor 402 with as much current as possible. This is accomplished, in part, through the interaction of transistors 418 and 420. As the voltage appearing at node "M" swings high, the negative edge at the input of capacitor 412 pulls node "N" low, thus turning transistor 418 "OFF" and turning clamping transistor 402 "ON". Therefore, the circuit 400 controls clamping transistor 402 so that clamping transistor 402 clamps node "C" to zero volts when node "B" is charged during charge pump charging cycles and unclamping node "C" when node "B" is driven downward during charge pump output cycles. Good operation at low $V_{CC}$ levels is achieved by using the $V_{CC}$ swing on capacitors 412 and 426 and by using the diode connected p-channel transistor clamps 420 and 422 to set absolute $+/-V_{tp}$ gate voltage levels for transistor 418. This ensures good operation as the three volt $V_{CC}$ level coupled across the capacitors is always greater than $2V_{tp}$.

The above description primarily describes the operation of the present invention in the standby mode. The preferred practice of the present invention also contemplates operation in a second high-output or "booted mode." The booted mode is activated whenever the device is operated in a high current mode such as programming. The booted mode is activated whenever the booted mode control signal "A" is "HIGH." Operation of the present invention in the "booted mode" is controlled by the substrate detector and booted mode control logic circuit 212 which is shown in schematic form as the circuit 500 in FIG. 5. The substrate detector and booted mode control logic circuit 212 includes a means of detecting substrate voltage and selectively coupling the relatively fast clock signal to the dual-mode charge pump when charge is required by the substrate. The substrate detector and booted mode control logic circuit 212 further includes means for controlling the booted mode charge pump 326 when the booted mode is activated.

Whenever the present invention is in the standby mode, the booted mode control signal "A" is "LOW." In this state, transmission gate 328 is conductive, thus shorting capacitor CB. In addition, transmission gates 304 and 336 are non-conductive, thus isolating the booted mode operating signals from the dual mode charge-pump 202. When the booted mode control signal "A" goes "HIGH," transmission gate 328 is switched to a non-conductive state. In addition, transmission gate 304 couples signal "P" to the gate terminals of transistors 316 and 318 while transmission gate 302 isolates the relatively slow clock signal. As will be discussed below, control signal "P" is a gated version of the relatively fast clock signal wherein the relatively fast clock signal is coupled to transmission gate 304 whenever energy is required from the charge pump.

Figure 5:
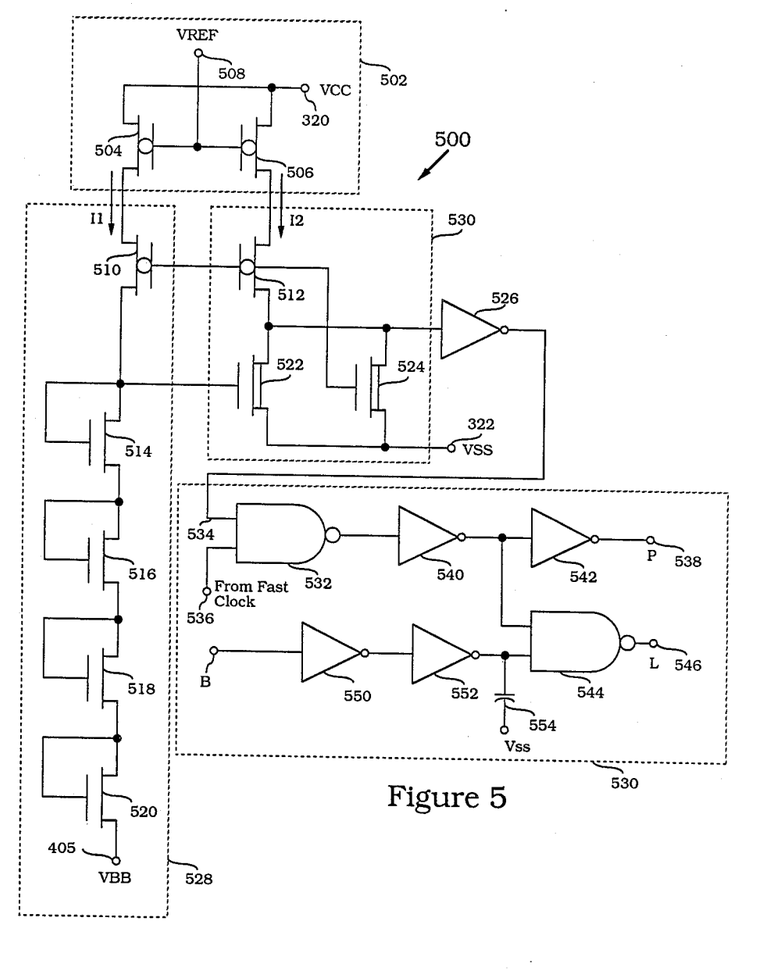
FIG. 5 is a schematic diagram of the charge pump capacitor control section which cooperates with the dual mode charge pump of FIG. 1.

Referring now to FIG. 5, the circuit 500 includes a two-output current source 502 comprising p-channel transistors 504 and 506. Transistors 504 and 506 are disposed with their sources coupled to $V_{CC}$ terminal 320 and their gates coupled together. This common gate connection is further coupled to a voltage reference at terminal 508. The voltage reference coupled to terminal 508 may be any well known voltage reference configured to produce a reference voltage of approximately $V_{CC}-V_{tp}$ volts. The configuration of transistors 504 and 506 produces fixed currents I1, I2 out of the drains of transistors 504 and 506, respectively. Transistors 510 and 512 are disposed with their sources coupled to the drains of transistors 504 and 506, respectively, and their gates coupled together. The common gate connection of transistors 510 and 512 is further coupled to control signal "A" so that transistors 510 and 512 are turned off in the standby mode, thus disabling the circuit 500 and saving current in the standby mode. The drain of transistor 510 is coupled to the substrate $V_{BB}$ terminal 405 through a chain of series connected diodes comprising transistors 514, 516, 518 and 520. Transistors 514, 516, 518 and 520 are each disposed with their gates and drains coupled together. The common gate/drain connection of transistor 514 is coupled to the drain of transistor 510. The common gate/drain connection of transistor 516 is coupled to the source of transistor 514. The common gate/drain connection of transistor 518 is coupled to the source of transistor 516. The common gate/drain connection of transistor 520 is coupled to the source of transistor 518. The source of transistor 520 is coupled to the $V_{BB}$ terminal 405. The number of diodes in the diode chain can be varied to dictate the level of the $V_{BB}$ pump enable.

The drain of transistor 512 is coupled to the source of transistor 522. The gate of transistor 522 is coupled to the common drain connection of transistors 510 and 514. The drain of transistor 522 is coupled to $V_{SS}$ terminal 322. The common gate connection of transistors 510 and 512 is further coupled to the gate of transistor 524. The source of transistor 524 is coupled to the common drain/source connection of transistors 512 and 522. The drain of transistor 524 is coupled to the $V_{SS}$ terminal 322. The common connection of the source of transistor 524 and the common drain/source connection of transistors 512 and 522 is further coupled to the input of inverter 526.

The string of diodes formed by transistors 514–520 comprises current leaker 528. Current leaker 528 is disposed to couple the current I1 from current source 502 to the $V_{BB}$ terminal 405. When $V_{BB}$ is within desired limits, the voltage on the gate of transistor 522 is more negative than the depletion threshold of transistor 522. Therefore, transistor 522 is disabled and the source of transistor 524 is pulled "HIGH." This in turn forces the output of inverter 526 "LOW." When $V_{BB}$ rises due to normal leakage and the leakage provided through current leaker 528, the current I1 is diverted into the gate of transistor 522 and the input of inverter 526 is pulled "LOW," thus driving its output "HIGH."

The output of inverter 526 is used to control the booted mode logic section 530. The booted mode logic section 530 includes NAND gate 532 which is disposed with one input (terminal 534) coupled to the output of inverter 526. Another input of NAND gate 532 (terminal 536) is coupled to the relatively fast clock signal. The output of NAND gate 532 is coupled to terminal 538 through inverters 540 and 542. Whenever the substrate voltage $V_{BB}$ is not within desired limits, the output of inverter 526 is held high through the action of transistor 522, 524 and current source 502. This enables NAND gate 532 to couple the relatively fast clock signal to terminal 538 and the transmission gate 304. Therefore, the relatively fast clock signal is coupled to terminal "P" whenever $V_{BB}$ is not within acceptable limits.

The booted mode timing logic section 530 further includes NAND gate 544 which is disposed with one input coupled to the output of inverter 540. The signal appearing at this node is 180 degrees out-of-phase with control signal "P," and therefore NAND gate 544 is enabled only when signal "P" is low. The other input of NAND gate 544 is coupled to node "B" through inverters 550 and 552. Logic timing is provided by capacitor 554 which is disposed between the output inverter 552 and $V_{SS}$. The output of NAND gate 544 is coupled to terminal 546 and it comprises control signal "L." As noted above, control signal "L" is used to control the common junction of capacitor CB and transmission gates 328 and 336 when the present invention is operated in the booted mode. Whenever a booted mode charging cycle is active, signal "P" and signal "L" are coupled to the dual mode charge pump 326. On the positive going edge of signal "P," node "C" of capacitor Cp is clamped to zero volts by transistor 402 while node "X" of capacitor CB is clamped to zero volts by signal "L" and transmission gate 336. Once node "B" reaches approximately $V_{CC}$ volts, the input of inverter 550 is driven high. This drives the output of inverter 552 high which charges capacitor 554. Once the voltage on capacitor 554 reaches a logic high level, signal "L" is forced low by NAND gate 544. This in turn drives node "X" and the output of inverter 334 high to $V_{CC}$ while disabling transistor 324 and isolating node "B" from transistor 316. As node "X" is driven to $V_{CC}$, the charge stored on capacitor CB is shared with capacitor Cp, thus developing a voltage across Cp which is greater than $V_{CC}$.

On the negative edge of signal "P," transistor 318 switches node "B" to zero volts, thus driving node "C" to a negative voltage. Therefore, in the booted mode, capacitors CB and Cp are charged, and the charge stored on capacitor CB is transferred to capacitor Cp during the positive excursions of the clock signal. On the negative edge of the clock signal, the pump side of the charge pump capacitor Cp is coupled to zero volts, thus driving the output side of the charge pump capacitor to a negative voltage.

Figure 6:
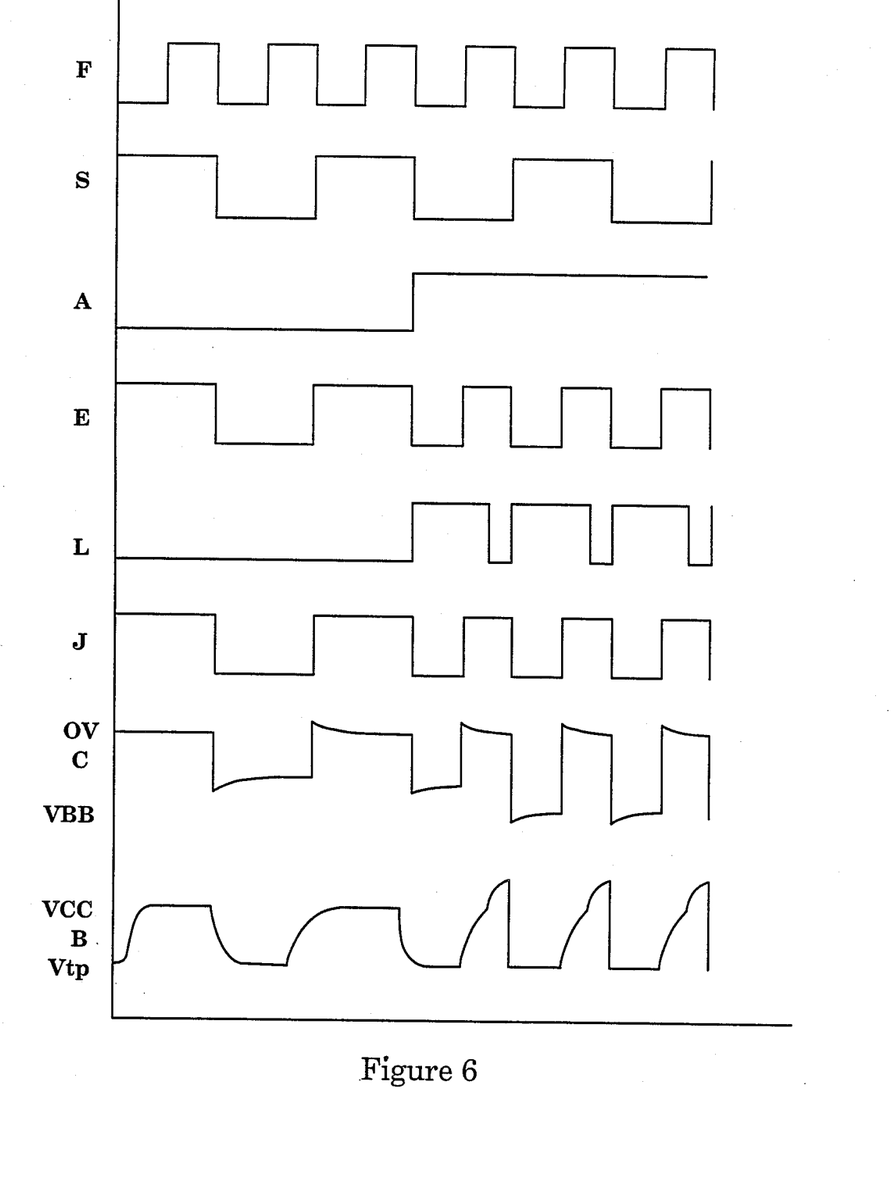
FIG. 6 is a timing diagram showing various signals generated during the operation of the present invention.

Referring now to FIG. 6, there is shown a timing diagram detailing the operation of the present invention in its standby and booted modes. Graphs S and F are representations of the slow and fast clock signals. Graph A is a representation of the booted mode enable signal "A." When the booted mode enable signal "A" is high, the booted mode is enabled and the clock present invention switches from the relatively slow clock signal to the relatively fast clock signal, as shown in Graph E. Graph E is a representation of the signal appearing at the gate of transistor 316, assuming the substrate voltage is not within desired limits. The resulting waveforms appearing across capacitors CB and Cp are shown in Graphs B and C which correspond to the nodes having similar designations in FIGS. 4 and 5. As can be seen in Graph C, node "C" is precharged and booted before the falling edge of the clock signals. This is controlled by control signal "L" which controls the switching of node "X" based on the timing provided by capacitor 554.

In summary, an improved bias voltage generator has been described. The present invention incorporates a novel charge pump means which provides an improvement over prior bias voltage generators by clamping the output side of a charge pump capacitor during charging cycles, thus eliminating a voltage drop associated with clamping diodes in prior circuits. In another aspect of the present invention, means are provided for switching the present invention between standby and booted modes. In the booted mode, booting means are activated to provide increased output voltage during the booted mode. The booting means includes an auxiliary charge pump means for generating a charge pump output voltage at least as large in magnitude as the positive power supply input voltage. In the standby mode, the booting means is disabled by booted mode logic means. The booted mode logic means includes means for detecting the output voltage generator whenever its output voltage is within acceptable limits. In yet another aspect of the present invention, means are provided for selecting one of a plurality of clock signals for clocking the present bias voltage generator. The plurality of clock signals are disposed with a variety of frequencies and are selected based on a desired output current for the bias voltage generator. Accordingly, other uses and modifications will be obvious to a person of ordinary skill in the art and all of such uses are intended to fall within the scope of the present invention.

I claim:

1. An improved bias voltage generator for generating an output voltage having an opposite polarity than a power source input voltage comprising:
   (a) a first receiving means for receiving a first clock signal;
   (b) first charge pump means coupled to said power source and said first receiving means including a first charge pump capacitor having a charge pump side and an output side wherein said first charge pump means is responsive to said first clock signal for alternatively switching the charge pump side of said first charge pump capacitor between first and second voltages;
   (c) clamping means coupled to said first receiving means and said first charge pump means and responsive to said first clock signal for clamping the output side of said first charge pump capacitor to approximately zero volts when said charge pump side of said first charge pump capacitor is switched to said first voltage such that charge is coupled from said power source to said first charge pump capacitor and for unclamping the output side of said first charge pump capacitor when said charge pump side of said first charge pump capacitor is switched to said second voltage; and
   (d) output means coupled to the output side of said first charge pump capacitor for coupling the energy stored on said first charge pump capacitor to a load whenever said output side of said first charge pump capacitor is unclamped by said clamping means.

2. The improved bias voltage generator of claim 1 further including booted mode operating means comprising:
   (a) means for receiving a booted mode enable signal;
   (b) second charge pump means including a second charge pump capacitor having an output side and a charge pump side; and
   (c) control logic means responsive to said booted mode enable signal for causing charge to be coupled to said second charge pump capacitor and for coupling the output side of said second charge pump capacitor to said charge pump side of said first charge pump capacitor such that, before said clamping means unclamps the output side of said first charge pump capacitor, charge from said second charge pump capacitor is added to the charge coupled to said first charge pump capacitor by said clamping means.

3. The apparatus of claim 2 wherein said control logic means includes means for alternately switching the charge pump side of said second charge pump capacitor between third and fourth voltages;
  means for coupling said third voltage to the charge pump side of said second charge pump capacitor at the same time said first voltage is coupled to the charge pump side of said first charge pump capacitor;
  means for decoupling said first voltage from said charge pump side of said first capacitor when said second charge pump capacitor is coupled to said first charge pump capacitor; and
  means for causing said fourth voltage to be coupled to the charge pump side of said second charge pump capacitor when said second charge pump capacitor is coupled to said first charge pump capacitor.

4. The apparatus of claim 2 further including:
(a) second receiving means for receiving a second clock signal; and
(b) clock selecting means coupled to said first and second clock signals and said first and second charge pump means, said clock selecting means responsive to said booted mode enable signal for coupling said first clock signal to said first charge pump means whenever said booted mode enable signal is inactive and coupling said second clock signal to said first and second charge pump means whenever said booted mode enable signal is active.

5. The apparatus of claim 2 wherein said control logic means includes means responsive to said booted mode control signal, for shorting said booted mode capacitor when said booted mode enable signal is inactive.

6. The apparatus of claim wherein said clamping means is a transistor having gate source and drain terminals wherein said drain terminal is coupled to a voltage source having a voltage of approximately zero volts and said source terminal is coupled to the output side of said first charge pump capacitor wherein said drain terminal is coupled to said voltage source whenever a drive signal is applied to said gate terminal wherein said drive signal is generated whenever a charging voltage is applied to the charge pump side of said first charge pump capacitor.

7. The apparatus of claim 6 wherein said drive signal is of sufficient magnitude to render said transistor fully conductive.

8. The apparatus of claim 2 wherein said control logic means further includes detector means for detecting the voltage at the output of said bias voltage generator and for disabling said booted mode enable signal whenever said voltage at the output of said bias voltage generator is within a desired range.

* * * * *